(12) United States Patent
Jiao

(10) Patent No.: US 9,911,794 B2
(45) Date of Patent: Mar. 6, 2018

(54) ORGANIC LIGHT EMITTING DISPLAY DEVICE

(71) Applicant: BOE TECHNOLOGY GROUP CO., LTD., Beijing (CN)

(72) Inventor: Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 100 days.

(21) Appl. No.: 14/437,086

(22) PCT Filed: Aug. 29, 2014

(86) PCT No.: PCT/CN2014/085479
§ 371 (c)(1),
(2) Date: Apr. 20, 2015

(87) PCT Pub. No.: WO2015/158096
PCT Pub. Date: Oct. 22, 2015

(65) Prior Publication Data
US 2016/0260785 A1 Sep. 8, 2016

(30) Foreign Application Priority Data

Apr. 16, 2014 (CN) .......................... 2014 1 0153336

(51) Int. Cl.
*H01L 27/32* (2006.01)
*H01L 51/52* (2006.01)

(52) U.S. Cl.
CPC ........ *H01L 27/3246* (2013.01); *H01L 27/326* (2013.01); *H01L 51/5259* (2013.01)

(58) Field of Classification Search
CPC .................................................. H01L 27/3246
(Continued)

(56) References Cited

U.S. PATENT DOCUMENTS 4,143,297 A * 3/1979 Fischer .................. H05B 33/12
313/502
6,894,433 B2 5/2005 Chuang
(Continued)

FOREIGN PATENT DOCUMENTS

CN 101093878 A 12/2007
CN 101295768 A 10/2008
(Continued)

OTHER PUBLICATIONS

Notification of the First Office Action corresponding to Chinese application No. 201410153336.1 dated Jan. 21, 2015.
(Continued)

*Primary Examiner* — Christopher Raabe
(74) *Attorney, Agent, or Firm* — Nath, Goldberg & Meyer; Joshua B. Goldberg

(57) ABSTRACT

The present invention provides an organic light emitting display device, belonging to the field of display technology, being capable of solving the problem, in an existing organic light emitting display device, of shortened service life of an organic light emitting diode due to moisture escape from the thin film transistor layer or the like. The organic light emitting display device of the present invention comprises a first pixel defining layer doped with a desiccant, which absorbs moisture escaping from an array substrate or the like during the use of the organic light emitting display device, thus improving the ageing and shrinkage of some pixels in the organic light emitting display device and prolonging the service life of the organic light emitting display device.

20 Claims, 1 Drawing Sheet

(58) Field of Classification Search
USPC ..... 313/498–512; 315/169.3; 345/36, 45, 76
See application file for complete search history.

(56) References Cited

U.S. PATENT DOCUMENTS

| | | | |
|---|---|---|---|
| 2002/0058420 A1 | 5/2002 | Lee et al. | |
| 2004/0090178 A1* | 5/2004 | Chuang | H01L 27/3246 313/506 |
| 2005/0057151 A1* | 3/2005 | Kuwabara | H05B 33/22 313/506 |
| 2005/0140285 A1* | 6/2005 | Park | H01L 27/3246 313/506 |
| 2009/0108748 A1* | 4/2009 | Toyoda | H01L 51/5259 313/504 |
| 2009/0243484 A1* | 10/2009 | Mizuno | H01L 51/5259 313/512 |
| 2015/0056757 A1* | 2/2015 | Liu | H01B 3/441 438/127 |
| 2015/0287770 A1* | 10/2015 | Sato | H01L 27/3246 257/40 |

FOREIGN PATENT DOCUMENTS

| | | |
|---|---|---|
| CN | 101330095 A | 12/2008 |
| CN | 101615625 A | 12/2009 |
| CN | 103972267 A | 8/2014 |
| CN | 203910804 U | 10/2014 |
| JP | 2004362792 A | 12/2004 |

OTHER PUBLICATIONS

Written Opinion of the International Searching Authority dated Jan. 19, 2015 corresponding to application No. PCT/CN2014/085479.
International Search Report dated Aug. 29, 2014 corresponding to application No. PCT/2014/085479.

* cited by examiner

ORGANIC LIGHT EMITTING DISPLAY DEVICE

This is a National Phase Application filed under 35 U.S.C. 371 as a national stage of PCT/CN2014/085479, filed Aug. 29, 2014, an application claiming the benefit of Chinese Application No. 201410153336.1, filed Apr. 16, 2014, the content of each of which is hereby incorporated by reference in its entirety.

FIELD OF THE INVENTION

The present invention belongs to the field of display technology, and particularly to an organic light emitting display device.

BACKGROUND OF THE INVENTION

An organic Light Emitting Diode (OLED), as an organic thin film electroluminescent device, has the advantages of simple fabrication process, low cost, high luminous efficiency, ease of formation of a flexible structure, and the like. Hence, the display technology of the organic light emitting diode becomes a hot spot to be researched and developed.

An organic light emitting diode display device includes a plurality of pixel units, each of the pixel units consists of a plurality of sub-pixel units being adjacent to each other and emitting light of different colors, and each of the sub-pixel units being provided with one organic light emitting diode therein. The light emitting intensity of organic light emitting diodes may be controlled by controlling the current of each of the organic light emitting diodes by a Thin Film Transistor (TFT) array, so as to realize displaying. Light emitted from the sub-pixel units of each pixel unit is mixed to form light to be emitted from this pixel unit. There may be many modes for the configuration of colors (i.e., the color of the color filter) of the sub-pixel units, for example, RGB (red, green and blue) mode (i.e., one red sub-pixel unit, one green sub-pixel unit and one blue sub-pixel unit form one pixel unit), RGBW (red, green, blue and white) mode, or RGBY (red, green, blue and yellow) mode.

A white Organic Light Emitting Diode (WOLED), due to being a mature technology and having high luminous efficiency, has been widely applied in the organic light emitting diode display device.

As shown in FIG. 1, in the prior art, an organic light emitting display device includes a thin film transistor array substrate 1, a color filter layer 3 (for example, including color filters R, G and B in FIG. 1) provided on the thin film transistor array substrate 1, a planarization layer 2 provided on the color filter layer 3, and an organic light emitting unit 11 provided on the planarization layer 2.

The organic light emitting unit 11 includes a plurality of sub-pixel units 12 divided by pixel defining layers 5, and each of the sub-pixel units 12 includes an anode 4 close to the thin film transistor array substrate 1 and a cathode 7 away from the thin film transistor array substrate 1 and an organic light emitting layer 6 between the anode 4 and the cathode 7. The anode 4 of each of the sub-pixel units 12 is controlled individually by one thin film transistor, and the anode 4 is connected to the thin film transistor through a via. As the cross-section is not at the via, the via is not shown in FIG. 1. All cathodes 7 of the whole organic light emitting unit 11 are usually integrated.

An encapsulating layer 8 may be further provided on the cathodes 7 to encapsulate the organic light emitting display device.

The light emitting process of the organic light emitting display device as described above is as follows: by controlling the current intensity of the anode 4 of each of the sub-pixel units 12 in a pixel unit, the organic light emitting layers 6 in the sub-pixel units 12 emit white light of different brightness; and, those white light passes through the corresponding color filters R, G and B to form light of different colors. The light of different colors is mixed to form light to be emitted by this pixel unit.

It should be understood that the above-mentioned color filter layer 3 may be omitted if the organic light emitting layer itself emits light of three primary colors (for example, R, G and B). In this case, the organic light emitting unit 11 is directly fabricated on the thin film transistor array substrate 1.

However, in the prior art, although part of moisture in the thin film transistor array substrate 1 and the color filter layer 3 is removed by roasting during fabrication, it is unable to remove the moisture completely. Therefore, there is moisture escape during the use of the organic light emitting display device. The organic light emitting diode is so extremely sensitive to moisture that even a thimbleful of moisture escape may directly influence the service life of the organic light emitting diode, and thus influence the service life of the display panel.

SUMMARY OF THE INVENTION

An objective of the present invention is to provide an organic light emitting display device with prolonged service life, in order to solve the problem, in an existing organic light emitting display device in the prior art, of shortened service life of an organic light emitting diode due to moisture escape from the thin film transistor array substrate or the like.

To achieve the above objective, the present invention provides an organic light emitting display device, including an array substrate and an organic light emitting unit provided on the array substrate;

the organic light emitting unit includes a plurality of sub-pixel units divided by pixel defining layers, each of the sub-pixel units comprising a first electrode and a second electrode disposed opposite to each other and an organic light emitting layer located between the first electrode and the second electrode;

the pixel defining layers include a second pixel defining layer close to the organic light emitting layer and a first pixel defining layer away from the organic light emitting layer; and the first pixel defining layer is doped with a desiccant.

Preferably, the particle of the desiccant has a particle size ranging from 1 nm to 100 nm.

Preferably, the mass ratio of the desiccant in the first pixel defining layer is 5% to 50%.

Further preferably, the mass ratio of the desiccant in the first pixel defining layer is 20% to 40%.

Preferably, the thickness of the second pixel defining layer is larger than a thickness by which the first pixel defining layer is higher than one of the first electrode and the second electrode which is close to the array substrate.

Preferably, the desiccant is an organic desiccant or inorganic desiccant.

Preferably, the desiccant is any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

Preferably, the desiccant is an organic chelate of aluminum, lithium or zinc; optionally, the organic chelate is any one of $Alq_3$, $Znq_2$ and Liq.

By including a first pixel defining layer doped with a desiccant in the organic light emitting display device provided by the present invention, during the use of the organic light emitting display device, heat is generated particularly during the lighting process, this heat will accelerate the moisture escape from the thin film transistor array substrate 1 or other functional layers, and then the first pixel defining layer will absorb the escaping moisture. Therefore, the ageing and shrinkage of some pixels in the organic light emitting display device are improved and the service life of the organic light emitting display device is prolonged.

Figure 1:
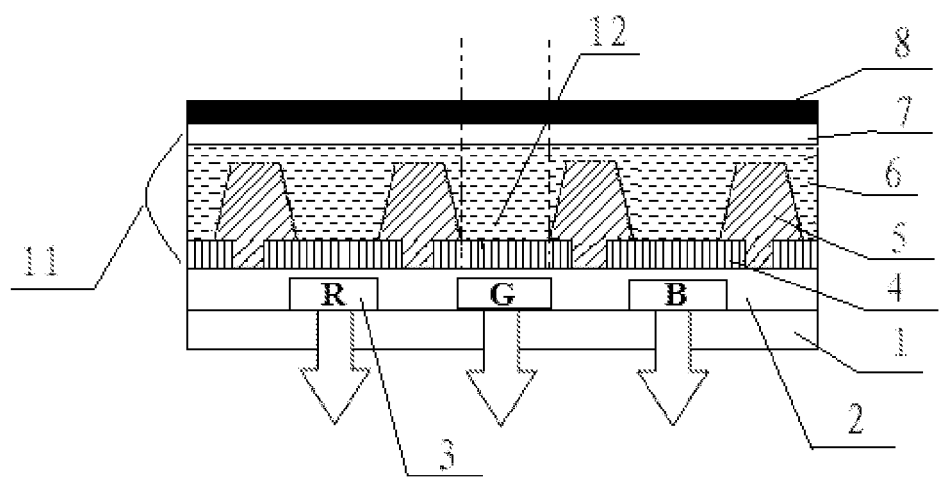
FIG. 1 is a cross-sectional diagram of an organic light emitting display device in the prior art.

in which:
1: Thin film transistor array substrate
2: Planarization layer
3: Color filter layer
4: Anode
5: Pixel defining layer
6: Organic light emitting layer
7: Cathode
8: Encapsulating layer
9: First pixel defining layer
10: Second pixel defining layer
11: Organic light emitting unit
12: Sub-pixel unit

DETAILED DESCRIPTION OF THE EMBODIMENTS

The present invention will be further described as below with reference to the accompanying drawings and embodiments, in order to make a person of ordinary skill in the art better understand the technical solution of the present invention.

Figure 2:
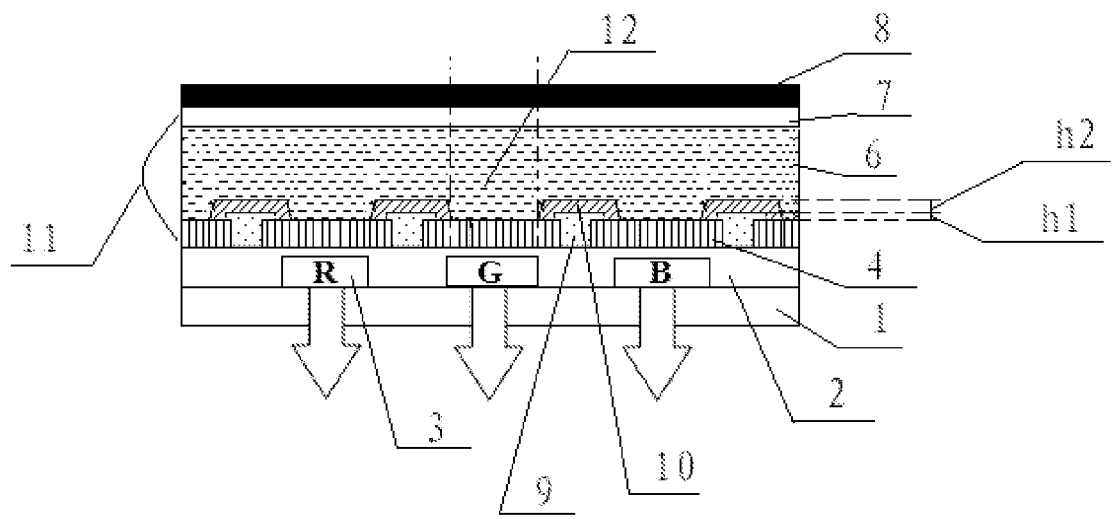
FIG. 2 is a cross-sectional diagram of an organic light emitting display device according to embodiments of the present invention.

As shown in FIG. 2, the present invention provides an organic light emitting display device, including a thin film transistor array substrate 1, a color filter layer 3 (for example, including color filters R, G and B in FIG. 2) provided on the thin film transistor array substrate 1, a planarization layer 2 provided on the color filter layer 3, and an organic light emitting unit 11 provided on the planarization layer 2.

The organic light emitting unit 11 includes a plurality of sub-pixel units 12 divided by pixel defining layers, and each of the sub-pixel units 12 includes an anode 4 close to the thin film transistor array substrate 1, a cathode 7 away from the thin film transistor array substrate 1 and opposite to the anode 4, and an organic light emitting layer 6 between the anode 4 and the cathode 7. The pixel defining layers include a second pixel defining layer 10 close to the organic light emitting layer 6 and a first pixel defining layer 9 away from the organic light emitting layer 6; and the first pixel defining layer 9 is doped with a desiccant.

As shown in FIG. 2, the pixel defining layers are disposed between the color filter layer 3 and the organic light emitting layer 6, to prevent moisture escape from the thin film transistor array substrate 1, the color filter layer 3 and other functional layers from influencing the organic light emitting layer 6, for example, oxidization or corrosion influences the organic light emitting unit and thus causes shortened service life thereof. The first pixel defining layer 9 close to the thin film transistor array substrate 1 and the color filter layer 3 is doped with a desiccant for absorbing the escaping moisture, in order to prevent the escaping moisture from influencing the organic light emitting layer 6; and meanwhile, the second pixel defining layer 10 close to the organic light emitting layer 6 entirely covers the first pixel defining layer 9, in order to prevent the moisture from escaping from the first pixel defining layer 9 which absorbs the escaping moisture from influencing the organic light emitting layer 6. Preferably, the thickness h2 of the second pixel defining layer 10 is larger than the thickness h1 by which the first pixel defining layer 9 is higher than the anode 4, in order to better prevent once-again moisture escape.

In the organic light emitting display device, the anode 4 of each of the sub-pixel units 12 is controlled individually by a thin film transistor, and the anode 4 is connected to the thin film transistor through a via. As the cross-section is not at the via, the via is not shown in FIG. 2. Schematically, the cathodes 7 of all sub-pixel units 12 of the organic light emitting display device are usually integrated in FIG. 2.

An encapsulating layer 8 may be further provided on the cathodes 7 to encapsulate the organic light emitting display device.

It should be understood that the above-mentioned color filter layer 3 may be omitted if the organic light emitting layer 6 itself emits light of three primary colors (for example, R, G and B). When the organic light emitting unit 11 is directly fabricated on the thin film transistor array substrate 1, both top-emission and bottom-emission organic light emitting display devices are possible, the difference lies only in the change of arrangement positions of the functional layers, such as the reflecting layer, that change the direction of light propagation. The pixel defining layers may also include a second pixel defining layer 10 close to the organic light emitting layer 6 and a first pixel defining layer 9 away from the organic light emitting layer 6; and the first pixel defining layer 9 is doped with a desiccant. This first pixel defining layer 9 may effectively prevent the moisture escaping from the thin film transistor array substrate from penetrating into the organic light emitting layer 6, thus protecting the organic light emitting layer 6.

For an OLED device in which the organic light emitting layer emits white light, the above-mentioned solution is also applicable to both top-emission and bottom-emission organic light emitting display devices. The first pixel defining layer doped with the desiccant may absorb the moisture escaping from the thin film transistor array substrate in the white-light OLED device, so as to protect the organic light emitting layer of the white-light OLED device. Further, for a white-light OLED having a structure as shown in FIG. 2 of the present invention, the function of the first pixel defining layer doped with the desiccant becomes more apparent, and it may not only absorb the moisture escaping from the thin film transistor array substrate, but also prevent the moisture escaping from the color filter layer 3 from penetrating into the organic light emitting layer of the white-light OLED.

As shown in FIG. 2, it should be understood that the material of the anode between the pixel defining layers is an oxide that is unlikely to be influenced by the escaping moisture, for example, indium tin oxide that may block the escaping moisture.

It should be understood that, FIG. 2 schismatically shows an organic light emitting display device structure. In other organic light emitting display devices, the positions of the anode and the cathode may be interchanged.

It should be understood that other functional layers except the pixel defining layers are within the scope of the prior art, hence the structure and material thereof in the prior art may be used and will not be described herein.

Preferably, the particle of the desiccant has a particle size ranging from 1 nm to 100 nm. In such a way, it is easier to better disperse particles of the desiccant in the host material of the first pixel defining layer 9, so that the particles of the desiccant are distributed in the first pixel defining layer 9 more evenly.

Preferably, the mass ratio of the desiccant in the first pixel defining layer 9 is 5% to 50%. Thus, the failure in absorption of the escaping moisture due to the insufficiency of the desiccant is avoided, and the impact on the formation of the first pixel defining layer 9 due to too much desiccant is also avoided.

Further preferably, the mass ratio of the desiccant in the first pixel defining layer is 20% to 40%. Within this mass ratio range, the film-forming performance of the first pixel defining layer 9 is good and the desiccant is able to absorb the escaping moisture effectively.

Preferably, the desiccant may be an inorganic desiccant. For example, the desiccant used in the embodiment may be any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

Preferably, the desiccant may also be an organic desiccant. For example, the desiccant is an organic chelate of aluminum, lithium or zinc. Optionally, the organic chelate is any one of $Alq_3$, $Znq_2$ and Liq.

It should be understood that other desiccants in the prior art are possible, as long as the desiccant can be dispersed evenly in the host material of the first pixel defining layer 9 to absorb the moisture.

Preferably, the host material of the pixel defining layers includes acrylic resin polymers. It should be understood that other materials in the prior art may be used as the material of the pixel defining layers.

Further preferably, the acrylic resin polymers include homopolymers or copolymers obtained by polymerizing acrylic acid or methacrylic acid with bulk polymers of methyl ester, ethyl ester, butyl ester, isooctyl ester, hydroxyethyl ester, epoxypropyl ester, dimethylaminoethyl ester, hexadecyl ester or octadecyl ester.

Preferably, the organic light emitting layer 6 is in a type of any one of full-fluorescence light emission, full-phosphorescence light emission or combination of fluorescence and phosphorescence light emission. It should be understood that the organic light emitting layer 6 may be other types in the prior art.

Embodiment 1

This embodiment provides an organic light emitting display device as shown in FIG. 2, including a thin film transistor array substrate 1, a planarization layer 2, a color filter layer 3, an anode 4, pixel defining layers, an organic light emitting layer 6, a cathode 7 and an encapsulating layer 8. The pixel defining layers include a second pixel defining layer 10 close to the organic light emitting layer 6 and a first pixel defining layer 9 away from the organic light emitting layer 6; and the first pixel defining layer 9 is doped with a desiccant.

The anode 4 is an Indium Tin Oxide (ITO) electrode, and the organic light emitting layer 6 is in a type of full-fluorescence light emission. Except the pixel defining layers, the fabrication of the above film layers is within the scope the prior art and will not be described herein.

The fabrication of the pixel defining layers will be introduced as below. The pixel defining layers include a first pixel defining layer 9 and a second pixel defining layer 10, wherein the first pixel defining layer 9 includes a host material and a guest material, wherein the host material is a homopolymer of methyl methacrylate, and the guest material is a desiccant. In this embodiment, the mass percentage of the calcium oxide as the desiccant in the first pixel defining layer 9 is 5%, and the particle size of the calcium oxide is 1 nm. In fabrication, the calcium oxide particles are dispersed in the homopolymer of methyl methacrylate and then the mixture is spin-coated onto the indium tin oxide anode layer (with a thickness of 1 μm) and is patterned to obtain the first pixel defining layer 9, wherein the thickness h1 by which the first pixel defining layer 9 is higher than the anode 4 is 1 μm. Subsequently, the homopolymer of methyl methacrylate is spin-coated separately and is patterned to obtain the second pixel defining layer 10, wherein the thickness h2 of the second pixel defining layer 10 is 1.5 μm. The exposure during the two patterning processes may be realized just by changing the distance between the mask plate and the substrate. Take using a positive photoresist during the lithography process as an example, the fabrication of the second pixel defining layer 10 through exposure may be realized just by shortening the distance between the mask plate and the substrate on the basis of the fabrication of the first pixel defining layer 9.

Embodiment 2

This embodiment provides an organic light emitting display device as shown in FIG. 2, including a thin film transistor array substrate 1, a planarization layer 2, a color filter layer 3, an anode 4, pixel defining layers, an organic light emitting layer 6, a cathode 7 and an encapsulating layer 8. The pixel defining layers include a second pixel defining layer 10 close to the organic light emitting layer 6 and a first pixel defining layer 9 away from the organic light emitting layer 6; and the first pixel defining layer 9 is doped with a desiccant.

The anode 4 is an Indium Tin Oxide (ITO) electrode, and the organic light emitting layer 6 is in a type of full-phosphorescence light emission. Except the pixel defining layers, the fabrication of the above film layers is within the scope of the prior art and will not be described herein.

The fabrication method of the pixel defining layers will be introduced as below. The pixel defining layers include a first pixel defining layer 9 and a second pixel defining layer 10, wherein the first pixel defining layer 9 includes a host material and a guest material, wherein the host material is a copolymer of hexadecyl methacrylate, and the guest material is a desiccant. In this embodiment, the mass percentage of $Alq_3$ as the desiccant in the first pixel defining layer 9 is 50%, and the particle size of $Alq_3$ is 100 nm. In fabrication, the $Alq_3$ particles are dispersed in the copolymer of the hexadecyl methacrylate and then the mixture is spin-coated onto the indium tin oxide anode layer (with a thickness of 1 μm) and is patterned to obtain the first pixel defining layer 9, wherein the thickness h1 by which the first pixel defining layer 9 higher than the anode 4 is 1.5 μm. Subsequently, the copolymer of the hexadecyl methacrylate is spin-coated separately and is patterned to obtain the second pixel defining layer 10, wherein the thickness h2 of the second pixel defining layer 10 is 2.0 μm. The exposure during the two patterning processes may be realized just by changing the distance between the mask plate and the substrate. Take using a positive photoresist during the lithography process an example, the fabrication of the second pixel defining layer 10 through exposure may be realized just by shortening the distance between the mask plate and the substrate on the basis of the fabrication of the first pixel defining layer 9.

Embodiment 3

This embodiment provides an organic light emitting display device as shown in FIG. 2, including a thin film transistor array substrate 1, a planarization layer 2, a color filter layer 3, an anode 4, pixel defining layers, an organic light emitting layer 6, a cathode 7 and an encapsulating layer 8. The pixel defining layers include a second pixel defining layer 10 close to the organic light emitting layer 6 and a first pixel defining layer 9 away from the organic light emitting layer 6; and the first pixel defining layer 9 is doped with a desiccant.

The anode 4 is an Indium Tin Oxide (ITO) electrode, and the organic light emitting layer 6 is in a type of combination of phosphorescence and fluorescence light emission. Except the pixel defining layers, the fabrication of the above film layers is within the scope of the prior art and will not be described herein.

The fabrication method of the pixel defining layers will be introduced as below. The pixel defining layers include a first pixel defining layer 9 and a second pixel defining layer 10, wherein the first pixel defining layer 9 includes a host material and a guest material, wherein the host material is a copolymer of butyl acrylate, and the guest material is a desiccant. In this embodiment, the mass percentage of $Znq_2$ as the desiccant in the first pixel defining layer 9 is 40%, and the particle size of $Znq_2$ is 50 nm. In fabrication, the $Znq_2$ particles are dispersed in the copolymer of butyl acrylate and then the mixture is spin-coated onto the indium tin oxide anode layer (with a thickness of 1 μm) and is patterned to obtain the first pixel defining layer 9, wherein the thickness h1 by which the first pixel defining layer 9 is higher than the anode 4 is 1.8 μm. Subsequently, the copolymer of the butyl acrylate is spin-coated separately and is patterned to obtain the second pixel defining layer 10, wherein the thickness h2 of the second pixel defining layer 10 is 2.3 μm. The exposure during the two patterning processes may be realized just by changing the distance between the mask plate and the substrate. Take using a positive photoresist during the lithography process as an example, the fabrication of the second pixel defining layer 10 through exposure may be realized just by shortening the distance between the mask plate and the substrate on the basis of the fabrication of the first pixel defining layer 9.

Embodiment 4

This embodiment provides an organic light emitting display device as shown in FIG. 2, including a thin film transistor array substrate 1, a planarization layer 2, a color filter layer 3, an anode 4, pixel defining layers, an organic light emitting layer 6, a cathode 7 and an encapsulating layer 8. The pixel defining layers include a second pixel defining layer 10 close to the organic light emitting layer 6 and a first pixel defining layer 9 away from the organic light emitting layer 6; and the first pixel defining layer 9 is doped with a desiccant.

The anode 4 is an Indium Tin Oxide (ITO) electrode, and the organic light emitting layer 6 is in a type of full-fluorescence light emission. Except the pixel defining layers, the fabrication of the above film layers is within the scope of the prior art and will not be described herein.

The fabrication of the pixel defining layers will be introduced as below. The pixel defining layers include a first pixel defining layer 9 and a second pixel defining layer 10, wherein the first pixel defining layer 9 includes a host material and a guest material, wherein the host material is a copolymer of epoxypropyl acrylate, and the guest material is a desiccant. In this embodiment, the mass percentage of the magnesium oxide as the desiccant in the first pixel defining layer 9 is 20%, and the particle size of the magnesium oxide is 30 nm. In fabrication, the magnesium oxide particles are dispersed in the copolymer of the epoxypropyl acrylate and then the mixture is spin-coated onto the indium tin oxide anode layer (with a thickness of 1 μm) and is patterned to obtain the first pixel defining layer 9, wherein the thickness h1 by which the first pixel defining layer 9 is higher than the anode 4 is 1.2 μm. Subsequently, the copolymer of the epoxypropyl acrylate is spin-coated separately and is patterned to obtain the second pixel defining layer 10, wherein the thickness h2 of the second pixel defining layer 10 is 1.8 μm. The exposure during the two patterning processes may be realized just by changing the distance between the mask plate and the substrate. Take using a positive photoresist during the lithography process as an example, the fabrication of the second pixel defining layer 10 through exposure may be realized just by shortening the distance between the mask plate and the substrate on the basis of the fabrication of the first pixel defining layer 9.

It should be understood that the host materials of the first pixel defining layer 9 and the second pixel defining layer 10 may be different. The present invention has been introduced by taking the identical materials of the first pixel defining layer 9 and the second pixel defining layer 10, for ease of fabrication. The thin film transistors in the thin film transistor array substrate 1 may be low-temperature polycrystalline thin film transistors or metal oxide thin film transistors, which is not limited herein. Functional layers, such as the organic light emitting layer 6, may be deposited by vacuum evaporation or other processes. The encapsulating layer 8 may be obtained by glass encapsulation or other encapsulation processes, in order to encapsulate the whole device. Preferably, the encapsulation process may be performed in an $N_2$ atmosphere.

As the organic light emitting display device provided by the present invention includes a first pixel defining layer 9 doped with a desiccant, the organic light emitting display device generates heat during use, particularly in the lighting process, this heat will accelerate the moisture escape from the thin film transistor array substrate 1, the color filter layer 3 or other functional layers, and then the first pixel defining layer 9 doped with a desiccant will absorb the escaping moisture. In this way, the ageing and shrinkage of some pixels in the organic light emitting display device are improved and the service life of the organic light emitting display device is prolonged.

It may be understood that, the foregoing embodiments are merely exemplary embodiments employed for illustration of the principle of the present invention, and the present invention is not limited thereto. For a person of ordinary skill in the art, various variations and improvements may be made without departing from the spirit and scope of the present invention, and those variations and improvements shall also be regarded as being within the protection scope of the present invention.

The invention claimed is:

1. An organic light emitting display device, comprising an array substrate, a planarization layer on the array substrate, and an organic light emitting unit provided on the planarization layer;

the organic light emitting unit comprising a plurality of sub-pixel units divided by pixel defining layers, each of the sub-pixel units comprising a first electrode and a second electrode disposed opposite to each other and an organic light emitting layer located between the first electrode and the second electrode, wherein the first electrode is formed on the planarization layer, wherein the pixel defining layers comprise a first pixel defining layer formed on the planarization layer and between the first electrodes of two adjacent sub-pixel units, and a second pixel defining layer close to the organic light emitting layer and formed on the first pixel defining layer to completely cover the first pixel defining layer; and the first pixel defining layer is doped with a desiccant, and the desiccant is uniformly distributed in the first pixel defining layer.

2. The organic light emitting display device according to claim 1, wherein a particle of the desiccant has a particle size ranging from 1 nm to 100 nm.

3. The organic light emitting display device according to claim 1, wherein the mass ratio of the desiccant in the first pixel defining layer is 5% to 50%.

4. The organic light emitting display device according to claim 3, wherein the mass ratio of the desiccant in the first pixel defining layer is 20% to 40%.

5. The organic light emitting display device according to claim 1, wherein the thickness of the second pixel defining layer is larger than a thickness by which the first pixel defining layer is higher than one of the first electrode and the second electrode which is close to the array substrate.

6. The organic light emitting display device according to claim 1, wherein the desiccant is any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

7. The organic light emitting display device according to claim 1, wherein the desiccant is an organic chelate of aluminum, lithium or zinc.

8. The organic light emitting display device according to claim 7, wherein the organic chelate is any one of $Alq_3$, $Znq_2$ and Liq.

9. The organic light emitting display device according to claim 2, wherein the mass ratio of the desiccant in the first pixel defining layer is 5% to 50%.

10. The organic light emitting display device according to claim 9, wherein the mass ratio of the desiccant in the first pixel defining layer is 20% to 40%.

11. The organic light emitting display device according to claim 2, wherein the thickness of the second pixel defining layer is larger than a thickness by which the first pixel defining layer is higher than one of the first electrode and the second electrode which is close to the array substrate.

12. The organic light emitting display device according to claim 3, wherein the thickness of the second pixel defining layer is larger than a thickness by which the first pixel defining layer is higher than one of the first electrode and the second electrode which is close to the array substrate.

13. The organic light emitting display device according to claim 1, wherein a color filter layer is provided on the array substrate, and the planarization layer is provided on the color filter layer.

14. The organic light emitting display device according to claim 2, wherein the desiccant is any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

15. The organic light emitting display device according to claim 3, wherein the desiccant is any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

16. The organic light emitting display device according to claim 4, wherein the desiccant is any one of calcium sulfate, barium oxide, phosphorus pentoxide, calcium chloride, magnesium oxide, magnesium perchlorate, potassium hydroxide, aluminum oxide, silicon oxide, sodium hydroxide, calcium oxide, active anhydrous cupric sulfate, magnesium sulfate, sodium sulfate and potassium carbonate.

17. The organic light emitting display device according to claim 2, wherein the desiccant is an organic chelate of aluminum, lithium or zinc.

18. The organic light emitting display device according to claim 17, wherein the organic chelate is any one of $Alq_3$, $Znq_2$ and Liq.

19. The organic light emitting display device according to claim 3, wherein the desiccant is an organic chelate of aluminum, lithium or zinc.

20. The organic light emitting display device according to claim 19, wherein the organic chelate is any one of $Alq_3$, $Znq_2$ and Liq.

* * * * *